(12) United States Patent
Vanderhaegen et al.

(10) Patent No.: US 7,782,239 B2
(45) Date of Patent: Aug. 24, 2010

(54) MULTI-STAGE RESETTABLE SIGMA-DELTA CONVERTERS

(75) Inventors: Johan Peter Vanderhaegen, Sunnyvale, CA (US); Christoph Lang, Cupertino, CA (US)

(73) Assignee: Robert Bosch GmbH, Stuttgart (DE)

( * ) Notice: Subject to any disclaimer, the term of this patent is extended or adjusted under 35 U.S.C. 154(b) by 3 days.

(21) Appl. No.: 12/259,697

(22) Filed: Oct. 28, 2008

(65) Prior Publication Data

US 2010/0103012 A1 Apr. 29, 2010

(51) Int. Cl.
*H03M 1/66* (2006.01)
(52) U.S. Cl. .................. 341/143; 341/155; 341/144
(58) Field of Classification Search .......... 341/143, 341/144, 155; 375/247
See application file for complete search history.

(56) References Cited

U.S. PATENT DOCUMENTS

| | | | |
|---|---|---|---|
| 4,876,543 A * | 10/1989 | van Bavel | 341/143 |
| 5,682,160 A | 10/1997 | Ribner et al. | |
| 6,304,608 B1 | 10/2001 | Chen et al. | |
| 6,384,761 B1 | 5/2002 | Melanson | |
| 6,407,689 B1 * | 6/2002 | Bazarjani et al. | 341/143 |
| 6,677,875 B2 | 1/2004 | Dagher et al. | |
| 6,700,520 B1 | 3/2004 | Miller | |
| 6,744,392 B2 * | 6/2004 | Melanson | 341/143 |
| 6,839,010 B1 | 1/2005 | Tsyrganovich | |
| 6,920,182 B2 * | 7/2005 | Bolton, Jr. | 375/247 |
| 7,075,995 B2 | 7/2006 | Su | |
| 2002/0121994 A1 * | 9/2002 | Bolton, Jr. | 341/143 |
| 2004/0004994 A1 * | 1/2004 | Wu et al. | 374/170 |
| 2007/0096962 A1 * | 5/2007 | Koe et al. | 341/143 |
| 2008/0150776 A1 * | 6/2008 | DiGiandomenico et al. | 341/143 |

* cited by examiner

*Primary Examiner*—Jean B Jeanglaude
(74) *Attorney, Agent, or Firm*—Maginot, Moore & Beck

(57) ABSTRACT

A resettable multi-stage sigma-delta analog-to-digital (A/D) converter enables a sampled analog signal to be resolve with fewer cycles than a resettable single sigma-delta A/D converter. The resettable multi-stage converter includes a cascade of at least two resettable sigma-delta loops having a total number of integrators and an allocation of delays, a digital decimation filter, the digital decimation filter being coupled to the at least two resettable sigma-delta loops and the digital decimation filter includes a cascade of integrators, a number of the integrators in the cascade of integrators for the decimation filter being equal to the total number of integrators in the cascade of at least two resettable sigma-delta loops and an allocation of delays in the cascade of integrators being equal to the allocation of delays in the cascade of at least two resettable sigma-delta loops, a plurality of A/D converters having a resolution that is less than a resolution of the resettable multi-stage sigma-delta A/D converter, a plurality of digital-to-analog (D/A) converters, the plurality of A/D converters and the plurality of D/A converters coupling the cascade of at least two resettable sigma-delta loops to the digital decimation filter, and a reset line coupled to the integrators in the cascade of integrators for the at least two resettable sigma-delta loops and coupled to the integrators in the cascade of integrators for the digital decimation filter.

20 Claims, 7 Drawing Sheets

MULTI-STAGE RESETTABLE SIGMA-DELTA CONVERTERS

TECHNICAL FIELD

This disclosure relates generally to low power analog-to-digital converters, and, more particularly, to low power analog-to-digital converters implemented with sigma-delta converters.

BACKGROUND

Resettable sigma-delta analog-to-digital (A/D) converters, sometimes called incremental analog-to-digital converters, are known. A/D converters of this type are typically used for low frequency measurements, such as DC measurements or sensor applications. A converter of this design typically samples the input signal for a particular number of samples to generate a digital output having predetermined number of bits. The ratio of the number of analog samples to the number of bits in the digital output is known as the oversampling ratio. The achievable resolution for such a converter is a function of the oversampling ratio, but it is not solely dependent upon this ratio. Generally, a lower oversampling ratio provides a shorter conversion time, which is an important parameter for most low power applications.

An example of a resettable sigma-delta A/D converter is shown in FIG. 7. This converter configuration is called a first order, resettable sigma-delta A/D converter 700. An A/D converter 708 and a digital-to-analog (D/A) converter 710 divide the converter configuration into two domains. The area to the left of the converters is an analog domain and the area to the right of the converters is a digital domain. These two converters have a lower resolution than the output 714 of the circuit 700, and, may have even have a resolution of only a single bit. The output of the A/D converter 708 is fed back by the D/A converter 710 to the summing node 718 to provide a feedback function. The order level of the converter circuit 700 refers to the total number of integrators on the analog side of the converter. For the converter shown in FIG. 7, a single integrator 704 is provided. For a single integrator, $2^N$ samples are required to resolve N bits. The reset signal re-initializes the integrators in both domains.

In the operation of the circuit 700, the analog signal is sampled and provided to the integrator 720. The output of the integrator 720 is converted into a digital value by the converter 708. This converter quantizes the sample. The output of the converter 708 is provided to a digital integrator 724, which operates as a decimation filter to generate the output for the converter 700. The output of the converter 708 is also converted by to an analog signal by the converter 710. The analog signal is added to the input signal at the summing node 718. The integration on this composite signal by the integrator 720 moves the noise in the output of the converter 708 into the high frequency components of the integrator's output. After conversion of the integrator's output by the converter 708, the decimation filter operates as a low pass filter, which removes the high frequency components, including the noise. An appropriate settling time enables the output 714 to stabilize to a digital value for the sampled analog signal. The reset signal enables the active components in the circuit to be turned off to conserve electrical energy.

The sigma-delta A/D converter design of FIG. 7 can be enhanced by including a second integrator in the single loop. Such a converter is shown in FIG. 8. In this circuit 800, a pair of integrators 804 and 808 is provided in the analog domain and a pair of digital integrators 812 and 816 is provided in the digital domain. Again, an A/D converter 820 and a D/A converter 824 are provided to quantize the integrated analog sampled signal and provide analog feedback to both integrators through the summing nodes 828 and 830. The operation of this circuit is similar to that discussed above with reference to FIG. 7; however, the addition of an analog integrator enables the analog signal to be resolved for N bits with $2^{N/2}$ samples. Additional integrators may be added to the analog and digital sides to reduce the number of samples needed for an N bit resolution. Unfortunately, as the number of sample integrations increases, the signal also increases and the signal levels eventually exceed an acceptable level. In particular, the feedback configuration may cause overload and require complicated circuitry to implement a desired noise transfer function.

SUMMARY

To address the limitations of single loop sigma-delta A/D converters have two or more analog integrators, a resettable multi-stage sigma-delta A/D converter has been developed. The resettable multi-stage sigma-delta A/D converter includes a cascade of at least two resettable sigma-delta loops having a total number of integrators and an allocation of delays, a digital decimation filter, the digital decimation filter being coupled to the at least two resettable sigma-delta loops and the digital decimation filter includes a cascade of integrators, a number of the integrators in the cascade of integrators for the decimation filter being equal to the total number of integrators in the cascade of at least two resettable sigma-delta loops and an allocation of delays in the cascade of integrators being equal to the allocation of delays in the cascade of at least two resettable sigma-delta loops, a plurality of A/D converters having a resolution that is less than a resolution of the resettable multi-stage sigma-delta A/D converter, a plurality of digital-to-analog (D/A) converters, the plurality of A/D converters and the plurality of D/A converters coupling the cascade of at least two resettable sigma-delta loops to the digital decimation filter, and a reset line coupled to the integrators in the cascade of integrators for the at least two resettable sigma-delta loops and coupled to the integrators in the cascade of integrators for the digital decimation filter.

BRIEF DESCRIPTION OF THE DRAWINGS

The foregoing aspects and other features of a resettable multi-stage sigma-delta A/D converter are explained in the following description, taken in connection with the accompanying drawings.

DETAILED DESCRIPTION

Figure 1:
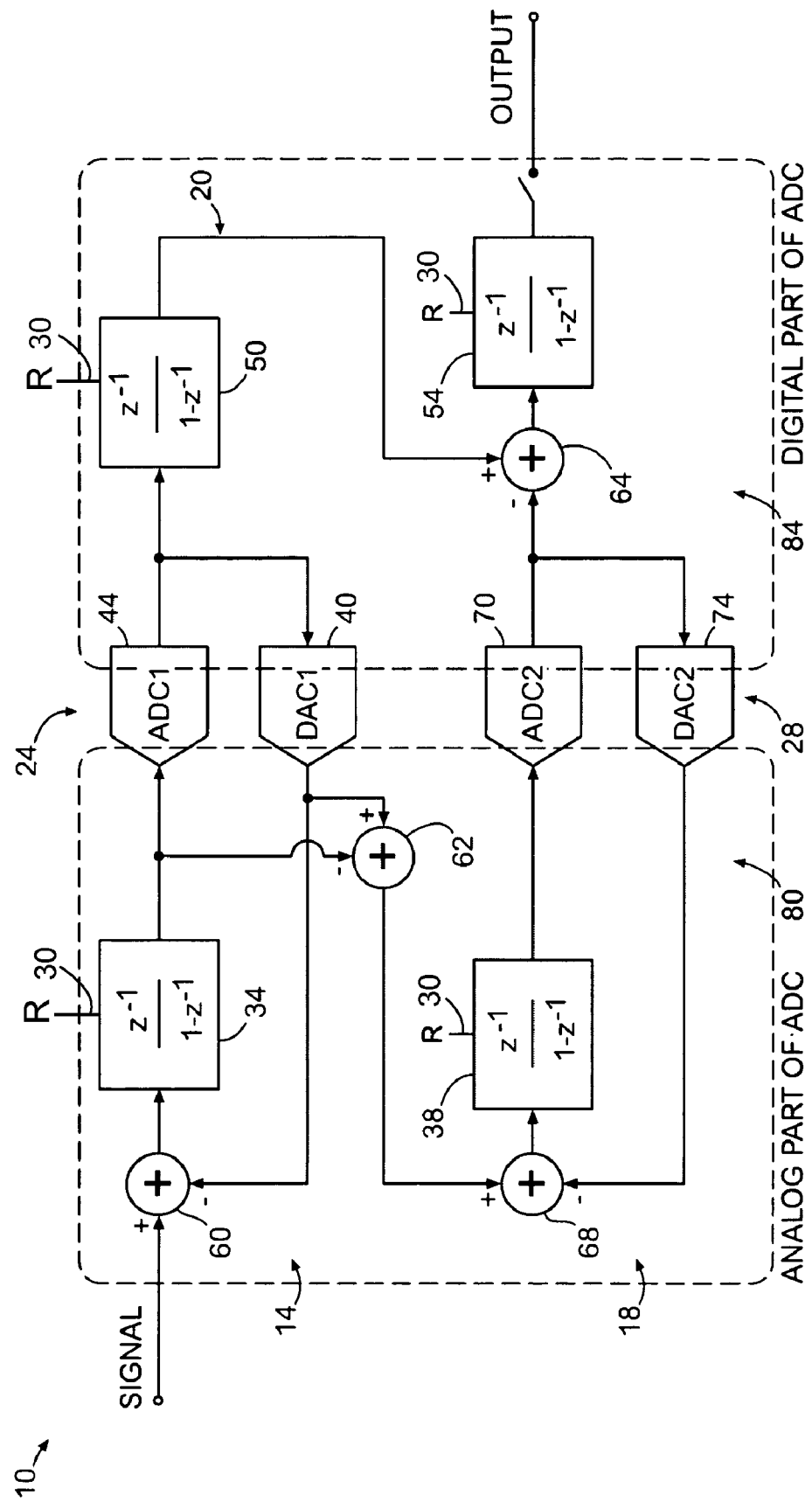
FIG. 1 is a schematic diagram of a resettable multi-stage sigma-delta A/D converter having two first order loops that calculates quantization error directly.

A circuit 10 that enables resettable operation of a multi-stage sigma-delta A/D converter that directly calculates quantization error is shown in FIG. 1. The circuit 10 includes a first stage 14, a second stage 18, a decimation filter 20, a plurality of A/D converters 24, a plurality of D/A converters 28, and a reset line 30. The first stage is a first order stage as it has only one integrator 34. The second stage is also a first order stage as it too has only one integrator 38. The two stages are coupled to one another by D/A converter 40, which provides the output of the first stage 14 generated by the A/D converter 44 to the input of the second stage 18. This configuration of multiple stages is known as a 1-1 configuration. In a similar manner other stages may be coupled to the multi-stage sigma-delta converter. Consequently, a multi-stage sigma-delta converter includes at least two stages in which the output of the previous stage is coupled to the input of the next stage. In this configuration the A/D converter directly calculates the quantization error of the stage and the D/A converter provides this error as input to the next stage.

The decimation filter 20 includes a plurality of integrators as well. The integrators 50 and 54 in the decimation filter 20 are configured in a cascade. The number of integrators in the decimation filter 20 is the same as the number of integrators in the multi-stage sigma-delta converter. All of the integrators in the circuit 10 are coupled to the reset line 30. All of the integrators in the sigma-delta converter and the decimation filter are unit delay integrators. Using the same number of delay integrators in the decimation filter that are in the multi-stage sigma-delta converter enables the sampled signal to be processed in synchronization by the converter and the filter. The reset signal enables the active components of circuit 10 to be turned off to conserve electrical energy. This aspect of circuits, such as circuit 10, is particularly useful in battery-powered applications.

The output of the first stage 14 is generated by A/D converter 44 and includes quantization error. This output is provided to the first integrator 50 of the decimation filter 20 as well as to the D/A converter 40. D/A converter 40 generates an analog signal that is provided as feedback to the first stage at summing node 60 where the analog signal is combined with the input signal being sampled. The analog signal from D/A converter 40 is also combined with the integrated output of integrator 34 at summing node 62 and provided as input to the integrator 38 of the second stage 18. The output of the integrator 38 is converted to digital data containing quantization error by A/D converter 70. The digital output of the A/D converter 70 is combined with the output of the first integrator 50 in the decimation filter by the summing node 64 and provided as input to the second integrator 54 of the decimation filter. The output of the A/D converter 70 is also provided to the D/A converter 74, which generates an analog feedback signal that is combined with the output of the summing node 62 by the summing node 68. Thus, the A/D converters 44 and 70 and the D/A converters 40 and 74 divide the circuit 10 into an analog domain 80 and a digital domain 84. The circuit 10 generates digital output at the output of the integrator 54, which includes the quantization error of the circuit. The number of bits generated by the integrator 54 is greater than the number of bits generated by the A/D converters 44 and 70. The circuit 10 is enabled to operate for an appropriate number of clock cycles to generate the digital output. In one embodiment, the circuit 10 operates for a minimum of 4096 clock cycles at a clock rate of 4 MHz.

Figure 2:
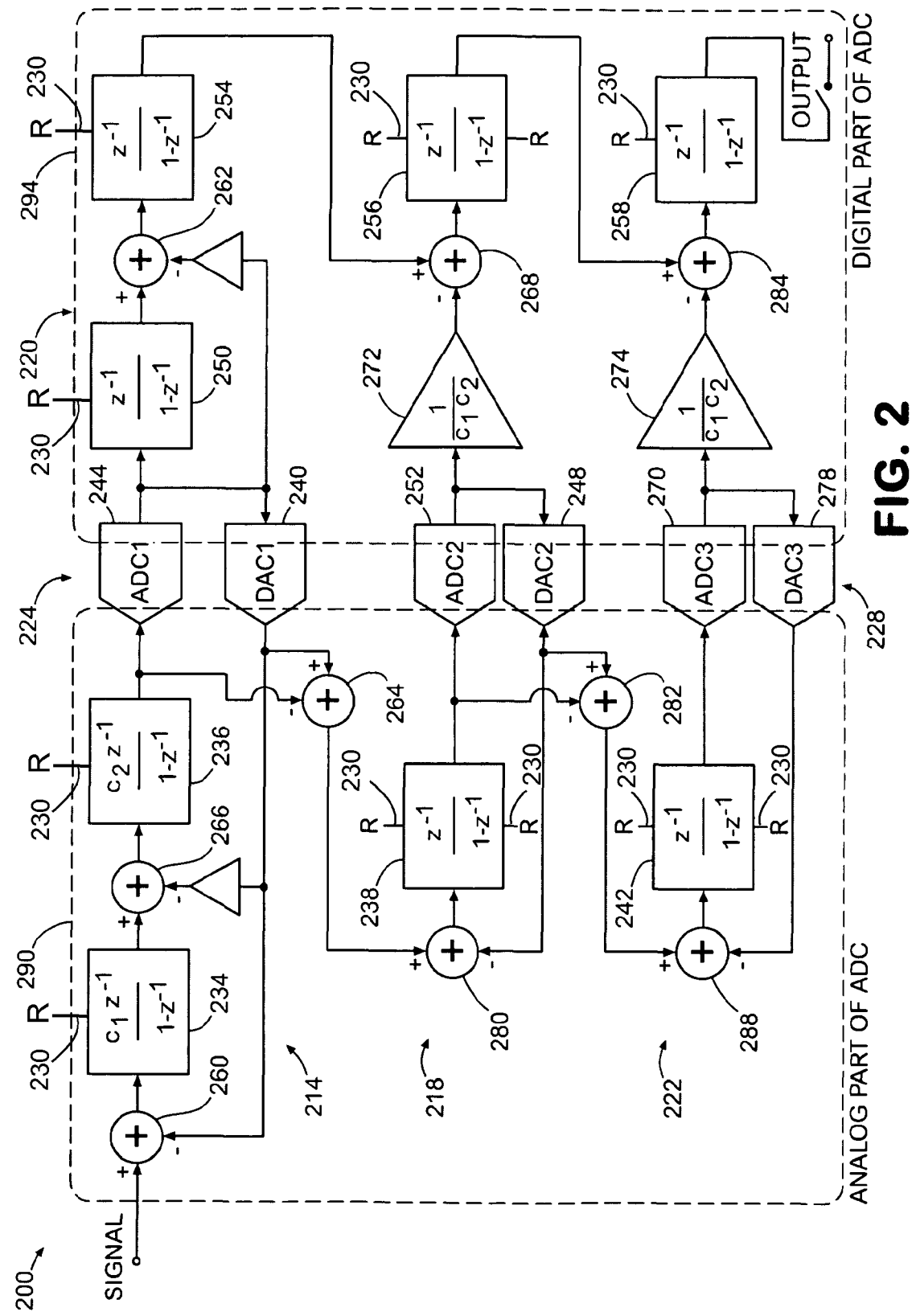
FIG. 2 is a schematic diagram of a resettable multi-stage sigma-delta A/D converter having one second order loop and two first order loops that calculates quantization error directly.

Another circuit 200 that enables resettable operation of a multi-stage sigma-delta A/D converter with the direct calculation of quantization error is shown in FIG. 2. The circuit 200 includes a first stage 214, a second stage 218, a third stage 222, a decimation filter 220, a plurality of A/D converters 224, a plurality of D/A converters 228, and a reset line 230. The first stage is a second order stage as it has two integrators 234 and 236. The second stage is a first order stage as it has only one integrator 238 and the third stage is also a first order stage as it has only one integrator 242. The three stages are coupled to one another by D/A converters 240, 248, and 278. D/A converter 240 provides the output of the first stage 214 generated by the A/D converter 244 to the input of the second stage 218. D/A converter 248 provides the output of the second stage 218 generated by the A/D converter 252 to the input of the third stage 222. This configuration of multiple stages is known as a 2-1-1 configuration. In a similar manner other stages of differing orders may be coupled to the multi-stage sigma-delta converter. Consequently, a multi-stage sigma-delta converter includes at least two stages in which the output of the previous stage is coupled to the input of the next stage and the stages may be of different orders. Again, the A/D converters directly calculate the quantization error of a stage and the D/A converter provides that error as an input to the next stage.

The decimation filter 220 includes a plurality of integrators as well. The integrators 250, 254, 256, and 258 in the decimation filter 220 are configured in a cascade. The number of integrators in the decimation filter 220 is the same as the number of integrators in the multi-stage sigma-delta converter. All of the integrators in the circuit 200 are coupled to the reset line 230. All of the integrators in the sigma-delta converter and the decimation filter are unit delay integrators. Using the same number of delayed integrators in the decimation filter that are in the multi-stage sigma-delta converter enables the sampled signal to be processed in synchronization by the converter and the filter. The reset signal enables the active components of circuit 200 to be turned off to conserve electrical energy. This aspect of circuits, such as circuit 200, is particularly useful in battery-powered applications.

The output of the first stage 214 is generated by A/D converter 244 and includes quantization error. This output is provided to the first integrator 250 of the decimation filter 220, to the D/A converter 240, and in a feed forward manner to a summing node 262. D/A converter 240 generates an analog signal that is provided as feedback to the first stage at summing nodes 260 and 266. At summing node 260, the analog feedback signal is combined with the input signal being sampled, while the output of the integrator 234 is combined with the analog feedback signal at summing node 266 for input to integrator 236. The analog signal from D/A converter 240 is also combined with the integrated output of integrator 236 at summing node 264 and provided as input to the integrator 238 of the second stage 218.

The output of the integrator 238 is converted to digital data containing quantization error by A/D converter 252 and scaled by scaler 272 before being summed with the output of the second integrator 254 in the decimation filter at the summing node 268 and provided as input to the third integrator 256 of the decimation filter. The output of the A/D converter 252 is also provided to the D/A converter 248, which generates an analog feedback signal that is combined with the output of the integrator 238 by the summing node 282. The analog feedback signal is also combined with the output of summing node 264 by the summing node 280 and provided as input to the third integrator 238 of the multi-stage sigma-delta converter.

In a similar manner, the output of the integrator 242 is converted to digital data containing quantization error by A/D converter 270 and scaled by scaler 274 before being summed with the output of the third integrator 256 in the decimation filter at the summing node 284 and provided as input to the fourth integrator 258 of the decimation filter 220. The output of the A/D converter 270 is also provided to the D/A converter 278, which generates an analog feedback signal that is combined with the output of the summing node 282 by the summing node 288 and provided as input to the fourth integrator 242 of the multi-stage sigma-delta converter. Thus, the A/D converters 244, 252, and 270 and the D/A converters 240, 248, and 278 divide the circuit 200 into an analog domain 290 and a digital domain 294. The circuit 200 generates digital output at the output of the integrator 258, which includes the calculation of the quantization error for the circuit. The number of bits generated by the integrator 258 is greater than the number of bits generated by the A/D converters 244, 252, and 270. As noted previously, the resettable sigma-delta A/D converter is enabled to operate for an appropriate number of clock cycles to generate the digital output.

Figure 3:
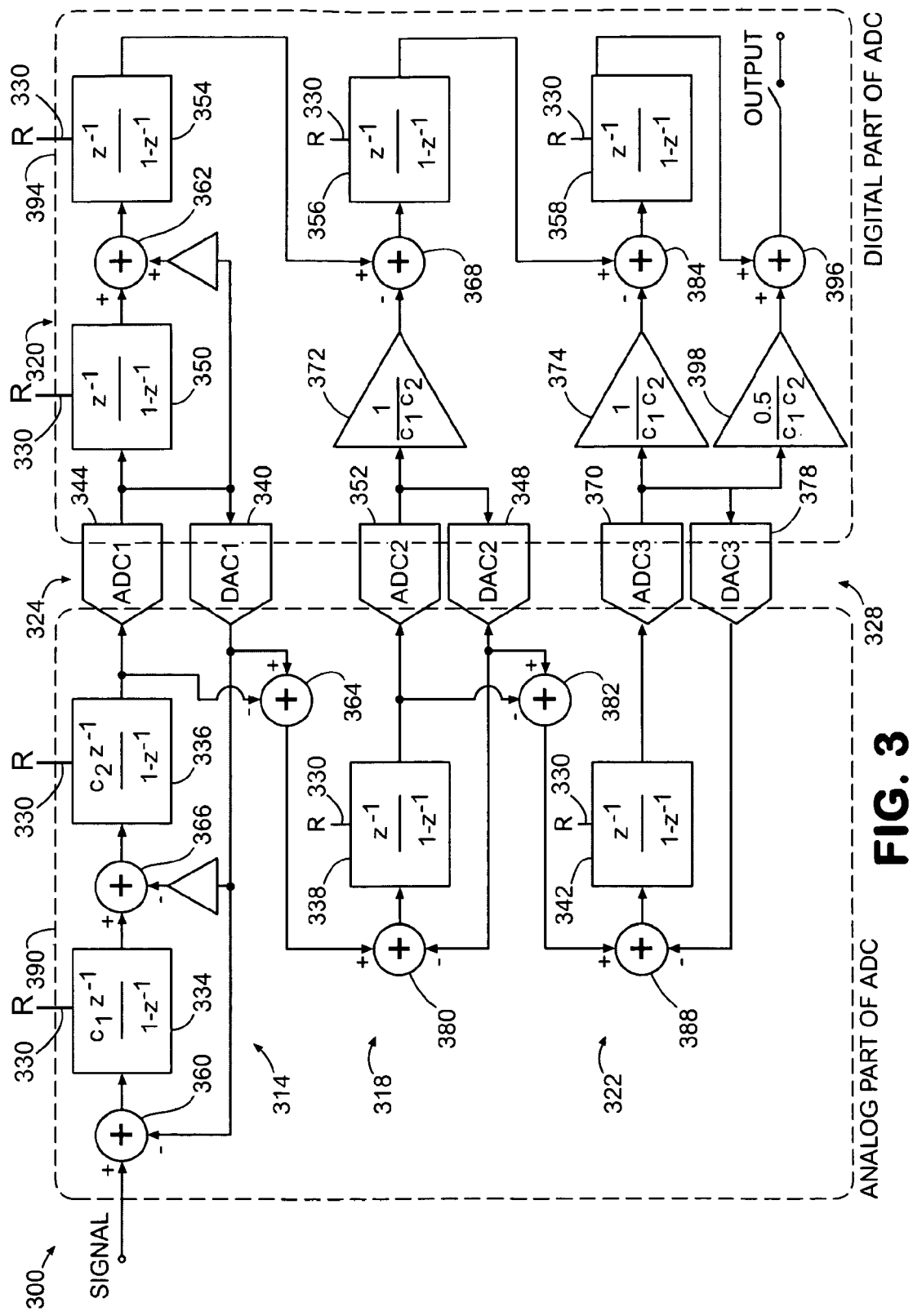
FIG. 3 is a schematic diagram of a resettable multi-stage sigma-delta A/D converter having one second order loop and two first order loops that calculates quantization error directly and adds quantization bits to the output of the converter.

Another circuit 300 that enables resettable operation of a multi-stage sigma-delta A/D converter with the direct calculation of quantization error is shown in FIG. 3. The circuit 300 includes a first stage 314, a second stage 318, a third stage 322, a decimation filter 320, a plurality of A/D converters 324, a plurality of D/A converters 328, and a reset line 330. The first stage is a second order stage as it has two integrators 334 and 336. The second stage is a first order stage as it has only one integrator 338 and the third stage is also a first order stage as it has only one integrator 342. The three stages are coupled to one another by D/A converters 340 and 348. D/A converter 340 provides the output of the first stage 314 generated by the A/D converter 344 to the input of the second stage 318. D/A converter 348 provides the output of the second stage 318 generated by the A/D converter 352 to the input of the third stage 322. This configuration of multiple stages is a 2-1-1 configuration as noted above with reference to FIG. 2.

The decimation filter 320 includes a plurality of integrators as well. The integrators 350, 354, 356, and 358 in the decimation filter 320 are configured in a cascade. The number of integrators in the decimation filter 320 is the same as the number of integrators in the multi-stage sigma-delta converter. All of the integrators in the circuit 300 are coupled to the reset line 330. All of the integrators in the sigma-delta converter and the decimation filter are unit delay integrators. Using the same number of delay integrators in the decimation filter that are in the multi-stage sigma-delta converter enables the sampled signal to be processed in synchronization by the converter and the filter. The reset signal enables the active components of circuit 300 to be turned off to conserve electrical energy. This aspect of circuits, such as circuit 300, is particularly useful in battery-powered applications.

The output of the first stage 314 is generated by A/D converter 344 and includes quantization error. This output is provided to the first integrator 350 of the decimation filter 320, to the D/A converter 340, and in a feed forward manner to a summing node 362. D/A converter 340 generates an analog signal that is provided as feedback to the first stage at summing nodes 360 and 366. At summing node 360, the analog feedback signal is combined with the input signal being sampled, while the output of the integrator 334 is combined with the analog feedback signal at summing node 366 for input to integrator 336. The analog signal from D/A converter 340 is also combined with the integrated output of integrator 336 at summing node 364 and provided as input to the integrator 338 of the second stage 318.

The output of the integrator 338 is converted to digital data containing quantization error by A/D converter 352 and scaled by scaler 372 before being summed with the output of the second integrator 354 in the decimation filter at the summing node 368 and provided as input to the third integrator 356 of the decimation filter. The output of the A/D converter 352 is also provided to the D/A converter 348, which generates an analog feedback signal that is combined with the output of the integrator 338 by the summing node 382. The analog feedback signal is also combined with the output of summing node 364 by the summing node 380 and provided as input to the third integrator 338 of the multi-stage sigma-delta converter.

In a similar manner, the output of the integrator 342 is converted to digital data containing quantization error by A/D converter 370 and scaled by scaler 374 before being summed with the output of the third integrator 356 in the decimation filter at the summing node 384 and provided as input to the fourth integrator 358 of the decimation filter 320. The output of the A/D converter 370 is also provided to the D/A converter 378, which generates an analog feedback signal that is combined with the output of the summing node 382 by the summing node 388 and provided as input to the fourth integrator 342 of the multi-stage sigma-delta converter. Thus, the A/D converters 344, 352, and 370 and the D/A converters 340, 348, and 378 divide the circuit 300 into an analog domain 390 and a digital domain 394.

The circuit 300 also includes a scaler 398 and a summing node 396. The scaler 398 receives the digital signal from A/D converter 370 and scales it before combining it to the output of the integrator 358 at the summing node 396. This addition increases the number of quantization bits in the digital output of the converter 300. The number of bits generated by the integrator 358 is greater than the number of bits generated by the A/D converters 344, 352, and 370. As noted previously, the resettable sigma-delta A/D converter is enabled to operate for an appropriate number of clock cycles to generate the digital output.

Figure 4:
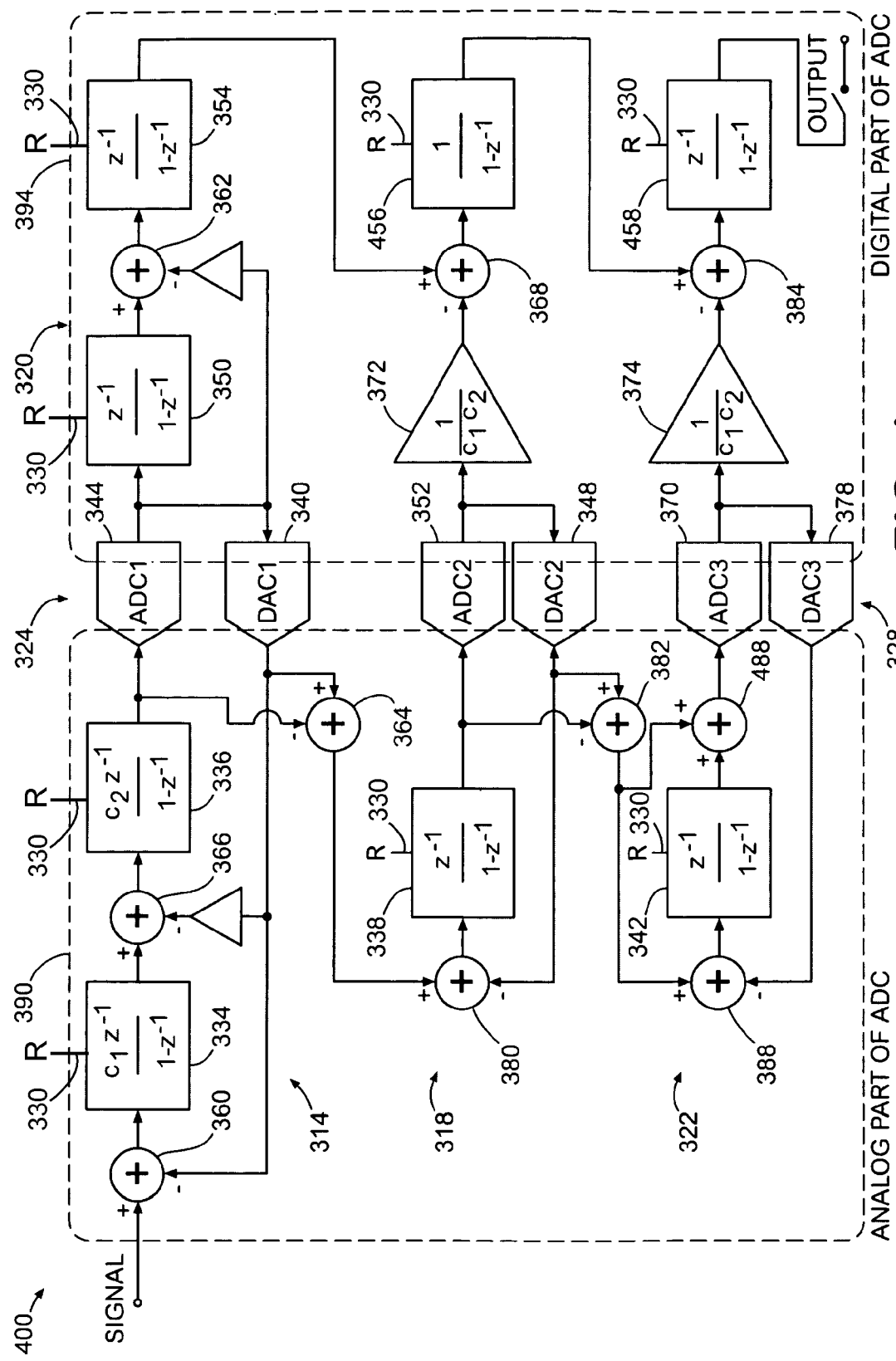
FIG. 4 is a schematic diagram of a resettable multi-stage sigma-delta A/D converter having one second order loop and two first order loops that calculates quantization error directly and has a feed-forward loop in the last loop of the converter.

Another circuit that enables resettable operation of a multi-stage sigma-delta A/D converter with the direct calculation of quantization error is shown in FIG. 4. Using like numbers to refer to like elements that have been previously discussed, the circuit 400 operates in a manner very similar to that discussed above with reference to FIG. 3. The circuit 400, however, includes a feed forward loop in the last analog loop 322. The feed forward loop sums the output of summing node 382 with the output of the integrator 342 at the summing node 488. The feed forward loop necessitates the inclusion of a non-delaying integrator 456 rather than the unit delay integrator 356 shown in FIG. 3. This substitution enables the allocation of delays on the digital side to be the same as the allocation of delays on the analog side, which is a requirement for resettable multi-stage sigma-delta A/D converters described herein. Although the circuit 400 does not include the scaler 398 and summing node 396 to increase the number of quantization bits in the output of the converter, it may include these components.

Figure 5:
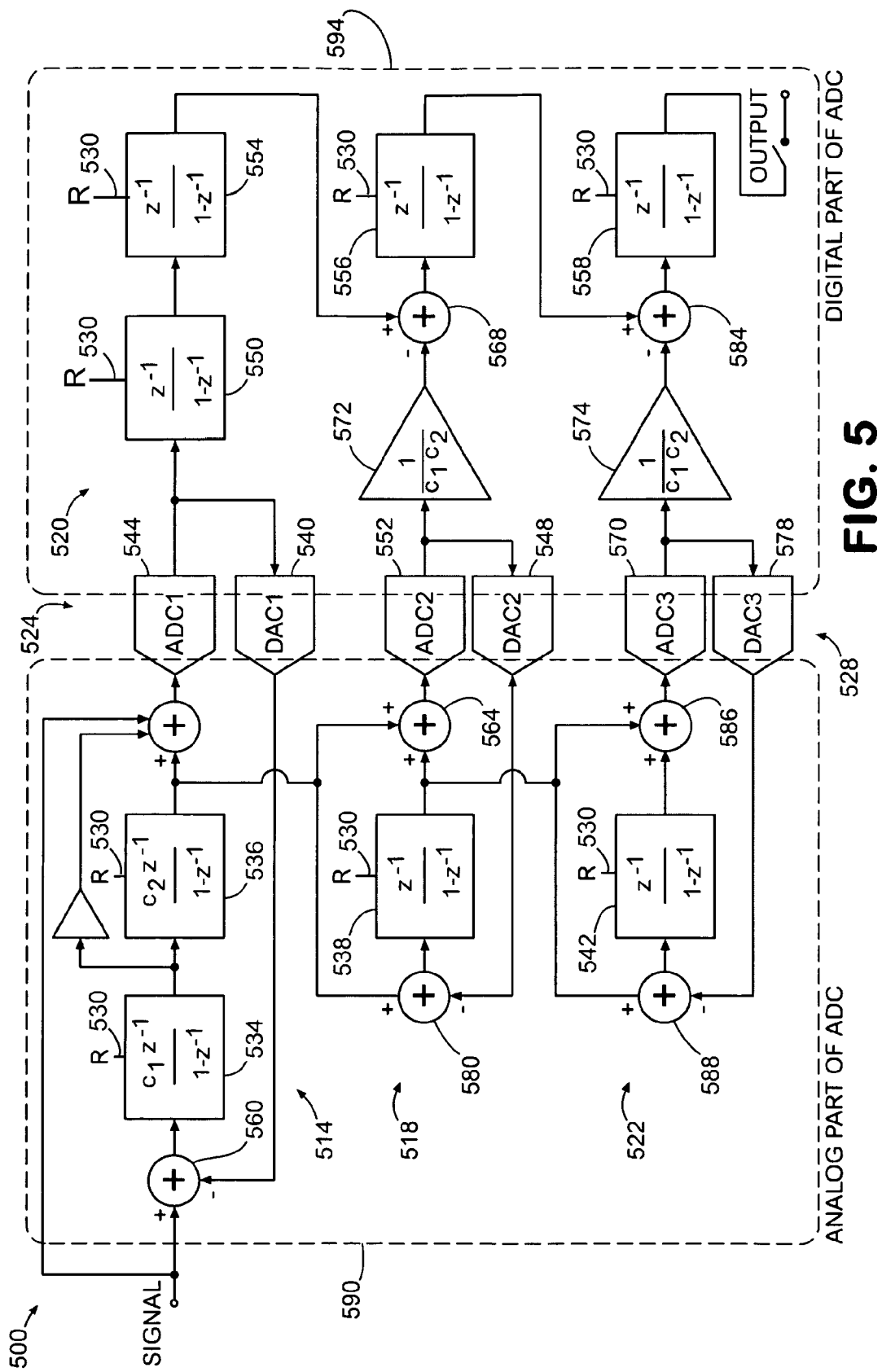
FIG. 5 is a schematic diagram of a resettable multi-stage sigma-delta A/D converter having one second order loop and two first order loops that calculates quantization error implicitly with feed-forward loops.

Another circuit 500 that enables resettable operation of a multi-stage sigma-delta A/D converter with implicit calculation of quantization error using feed forward loops is shown in FIG. 5. The circuit 500 includes a first stage 514, a second stage 518, a third stage 522, a decimation filter 520, a plurality of A/D converters 524, a plurality of D/A converters 528, and a reset line 530. The first stage is a second order stage as it has two integrators 534 and 536. The second stage is a first order stage as it has only one integrator 538 and the third stage is also a first order stage as it has only one integrator 542. The three stages are coupled to one another by forward loops as explained below rather than the D/A converters 540 and 548 as was the case in the circuits described above. The input signal to the first stage 514 is provided to the summing node 560 and to the summing node 504. The output of the first integrator 534 is also provided to the summing node 504, where the analog signal being sampled, the output of the integrator 534, and the output of the integrator 536 are summed and provided to the A/D converter 544. D/A converter 540 generates an analog feedback signal with the output of the A/D converter 544, which is provided to the summing node 360 of the first stage 514. The output of A/D converter 544 is also provided to the two integrators 550 and 554 of the decimation filter. The output of the integrator 554 is provided to the summing node 568.

The quantization error calculated by the integrator 536 in the circuits described above is now provided by a feed forward loop to the summing nodes 564 and 580. Summing node 580 provides input to the integrator 538 of the second stage. The output of this integrator is provided by another feed forward loop to the summing nodes 588 and 586. Summing node 588 combines the output of the integrator 538 and the analog feedback signal from the D/A converter 578 and provides the sum as input to the integrator 542. Thus, the analog stages are cascaded by the feed forward loops and this configuration of multiple stages is still called a 2-1-1 configuration for reasons similar to those noted above with reference to FIG. 2.

The summing nodes 564 and 586 provide input to the A/D converters 552 and 570, respectively. These A/D converters generate digital signals that are provided to the D/A converters 548 and 578, respectively. These D/A converters generate analog feedback signals that are sent to the summing nodes for the input to the integrators 538 and 542, respectively. The output of the A/D converters 552 and 570 are also provided to the scalers 572 and 574, respectively. The output of integrator 558 is the output of the converter 500.

In the circuit of FIG. 5, the integrators 550, 554, 556, and 558 in the decimation filter 520 are configured in a cascade. The number of integrators in the decimation filter 520 is the same as the number of integrators in the multi-stage sigma-delta converter. All of the integrators in the circuit 500 are coupled to the reset line 530 and all of the integrators are unit delay integrators. Using the same number of delay integrators in the decimation filter that are in the multi-stage sigma-delta converter enables the sampled signal to be processed in synchronization by the converter and the filter. The reset signal enables the active components of circuit 500 to be turned off to conserve electrical energy. This aspect of circuits, such as circuit 500, is particularly useful in battery-powered applications.

Figure 6:
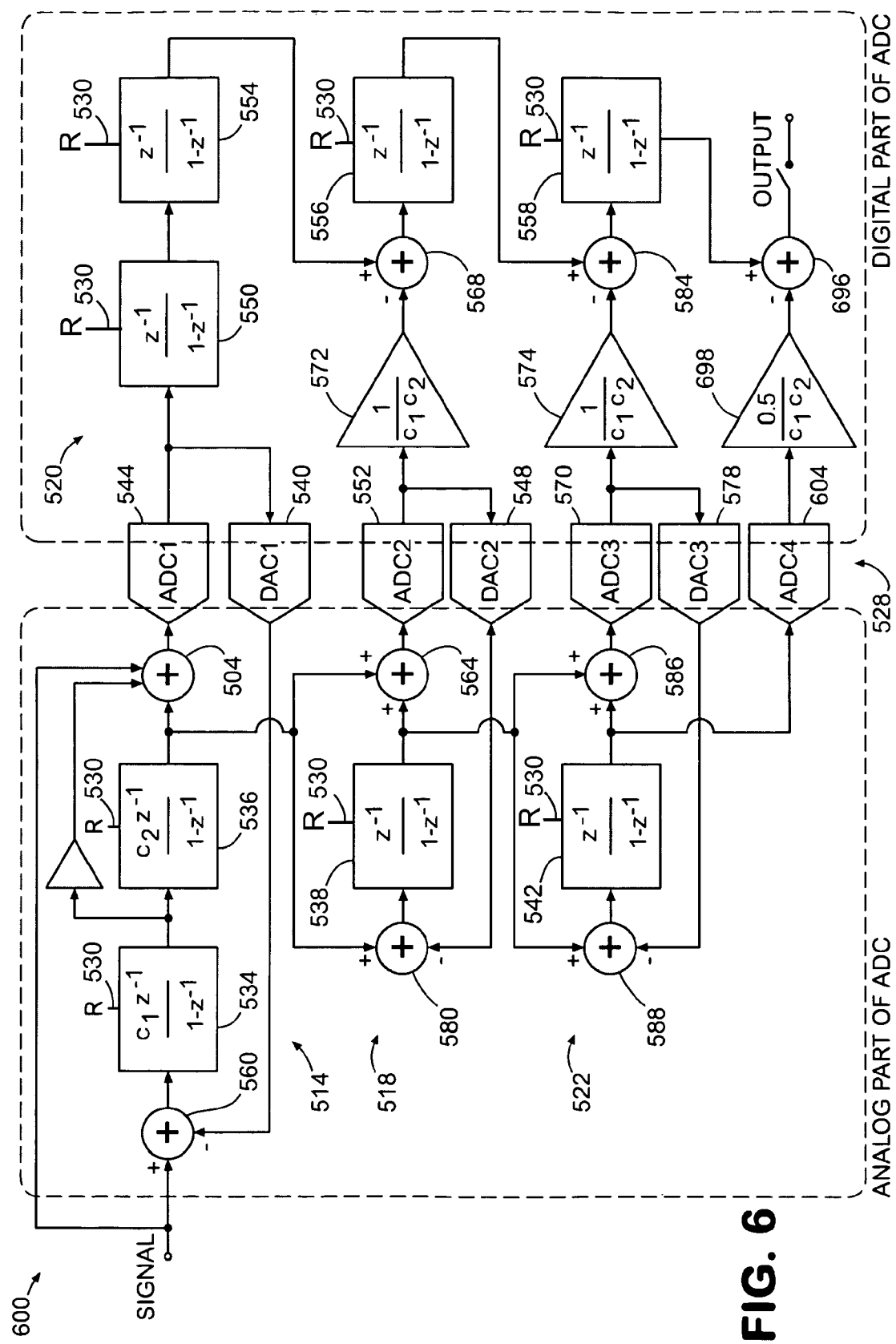
FIG. 6 is a schematic diagram of a resettable multi-stage sigma-delta A/D converter having one second order loop and two first order loops that calculates quantization error implicitly with feed-forward loops and that adds quantization bits to the output of the converter.
Figure 7:
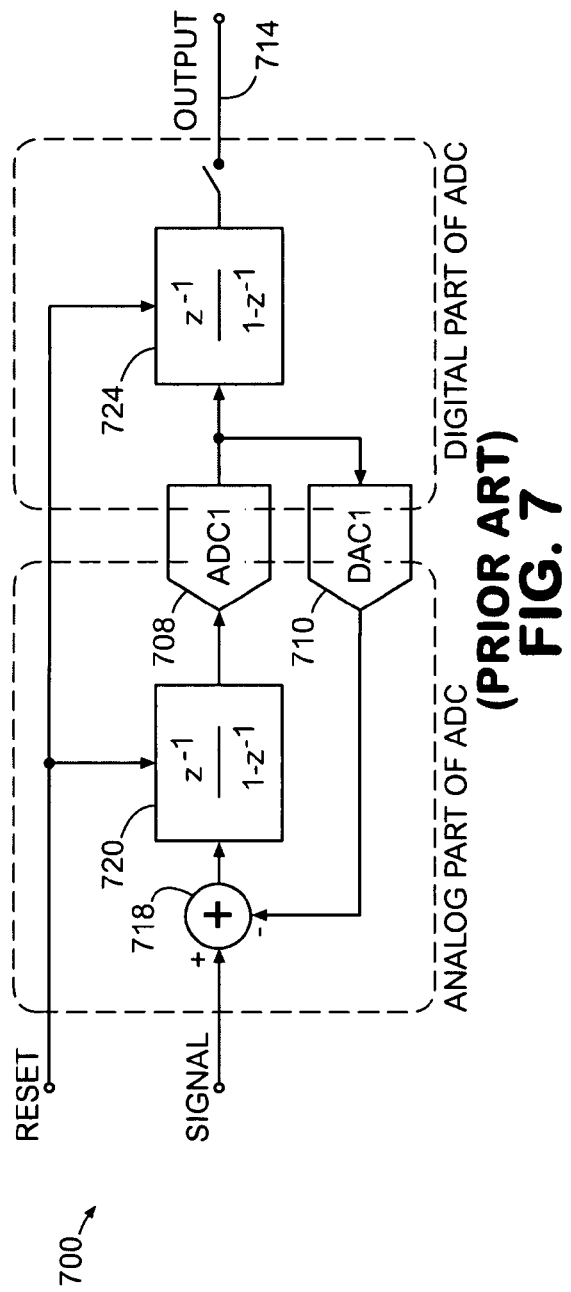
FIG. 7 is a schematic diagram of a resettable single stage first order sigma-delta A/D converter.
Figure 8:
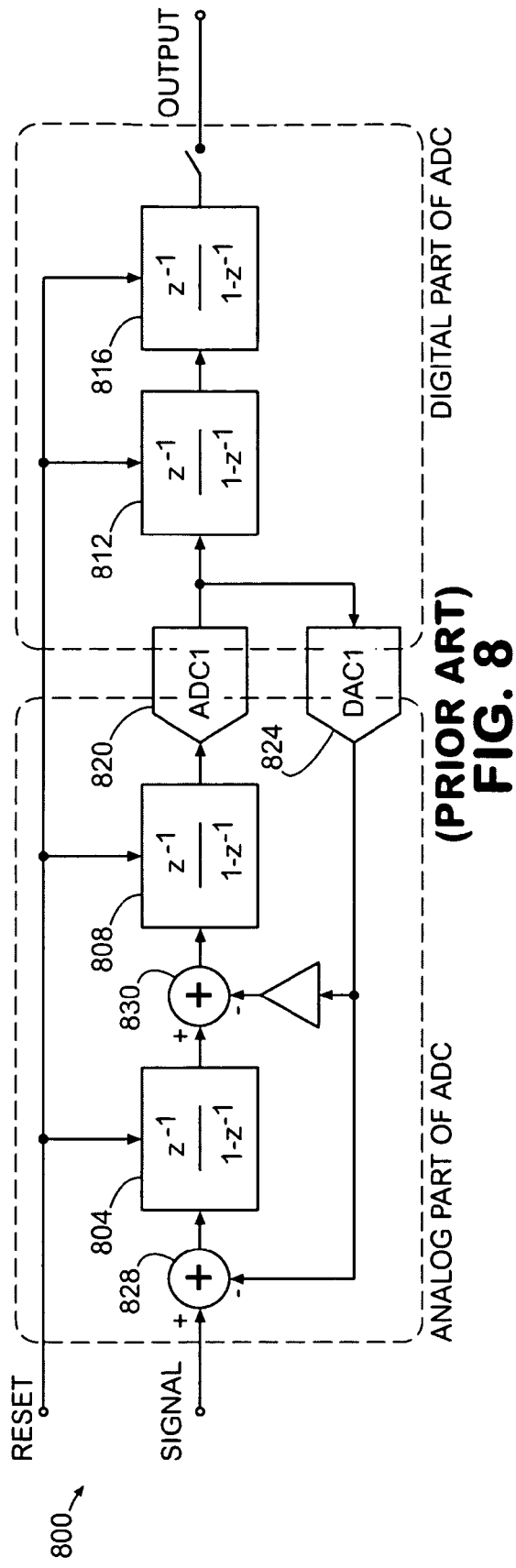
FIG. 8 is a schematic diagram of a resettable single stage second order sigma-delta A/D converter.

Another circuit that enables resettable operation of a multi-stage sigma-delta A/D converter with the implicit calculation of quantization error using feed forward loops is shown in FIG. 6. Using like numbers to refer to like elements that have been previously discussed, the circuit 600 operates in a manner very similar to that discussed above with reference to FIG. 5. The circuit 600, however, includes an A/D converter 604, a scaler 698 and a summing node 696, which operate in a manner similar to scaler 398 and node 396 described above. The A/D converter 604 receives the output of integrator 542 and generates a digital representation of the quantization error for the converter 600. The scaler 698 receives the digital signal from A/D converter 604 and scales it before adding it to the output of the integrator 558 at the summing node 696. This addition increases the number of quantization bits in the digital output of the converter 600. The number of bits generated by the integrator 558 is greater than the number of bits generated by the A/D converters 544, 552, and 570. As noted previously, the resettable sigma-delta A/D converter is enabled to operate for an appropriate number of clock cycles to generate the digital output. Although the circuit 600 includes an additional A/D converter to provide the additional quantization bits, the A/D converter 578 may be used provided that the conversion of the input signal has settled and the integrators have not been reset before the output of the integrator 542 is switched to the A/D converter 578.

Those skilled in the art will recognize that numerous modifications can be made to the specific implementations described above. Therefore, the following claims are not to be limited to the specific embodiments illustrated and described above. The claims, as originally presented and as they may be amended, encompass variations, alternatives, modifications, improvements, equivalents, and substantial equivalents of the embodiments and teachings disclosed herein, including those that are presently unforeseen or unappreciated, and that, for example, may arise from applicants/patentees and others.

We claim:

1. A resettable multi-stage sigma-delta analog-to-digital (A/D) converter comprising:
    a cascade of at least two resettable sigma-delta loops having a total number of integrators and an allocation of delays;
    a digital decimation filter, the digital decimation filter being coupled to the at least two resettable sigma-delta loops and the digital decimation filter including:
    a cascade of integrators, a number of the integrators in the cascade of integrators for the decimation filter being equal to the total number of integrators in the cascade of at least two resettable sigma-delta loops and an allocation of delays in the cascade of integrators being equal to the allocation of delays in the cascade of at least two resettable sigma-delta loops;
    a plurality of A/D converters having a resolution that is less than a resolution of the resettable multi-stage sigma-delta A/D converter;
    a plurality of digital-to-analog (D/A) converters, the plurality of A/D converters and the plurality of D/A converters coupling the cascade of at least two resettable sigma-delta loops to the digital decimation filter; and
    a reset line coupled to the integrators in the cascade of integrators for the at least two resettable sigma-delta loops and coupled to the integrators in the cascade of integrators for the digital decimation filter.

2. The resettable multi-stage sigma-delta A/D converter of claim 1 wherein the cascade of at least two resettable sigma-delta loops includes a number of feed forward loops between the at least two resettable sigma-delta loops; and
    the cascade of integrators for the digital decimation filter includes a number of non-delaying integrators that corresponds to the number of feed forward loops between the at least two resettable sigma-delta loops.

3. The resettable multi-stage sigma-delta A/D converter of claim 2 wherein the feed forward loop is in a last loop of the at least two resettable sigma-delta loops and the non-delaying integrator is a next-to-last integrator in the cascade of integrators for the digital decimation filter.

4. The resettable multi-stage sigma-delta A/D converter of claim 1 wherein the allocation of delays in the cascade of integrators for the digital decimation filter includes digital scaling that corresponds to the delays in the allocation of delays in the cascade of at least two resettable sigma-delta loops.

5. The resettable multi-stage sigma-delta A/D converter of claim 1 wherein the cascade of at least two resettable sigma-delta loops includes a feed forward loop in each resettable sigma-delta loop of the at least two resettable sigma-delta loops.

6. The resettable multi-stage sigma-delta A/D converter of claim 1 further comprising:
an adder that adds an output of a last A/D converter in the plurality of A/D converters to an output of a last integrator in the cascade of integrators for the digital decimation filter to increase a number of bits output by the resettable multi-stage sigma-delta A/D converter.

7. The resettable multi-stage sigma-delta A/D converter of claim 6 wherein the output of the last A/D converter is provided only to the adder.

8. The resettable multi-stage sigma-delta A/D converter of claim 6 wherein the output of the last A/D converter is provided to the adder and to a last D/A converter in the plurality of D/A converters.

9. The resettable multi-stage sigma-delta A/D converter of claim 1 wherein one of the at least two resettable sigma-delta loops is a resettable second order sigma-delta loop.

10. The resettable multi-stage sigma-delta A/D converter of claim 1 wherein the at least two resettable sigma-delta loops include a resettable second order sigma-delta loop and a resettable first order sigma-delta loop.

11. The resettable multi-stage sigma-delta A/D converter of claim 10 wherein the resettable first order sigma-delta loop follows the resettable second order sigma-delta loop in the cascade of the at least two resettable sigma-delta loops.

12. A method for converting an analog signal to a digital value comprising:
coupling an analog signal to a cascaded multi-stage sigma-delta converter having a first number of delay integrators;
converting an output of each stage of the multi-stage sigma delta converter to a digital value having fewer bits than a final output; and
digital filtering each converted output, the digital filtering being implemented with a second number of delay integrators, the second number of delay integrators being equal to the first number of delay integrators.

13. The method of claim 12 wherein the digital filtering is implemented with a decimation filter.

14. The method of claim 12 wherein each stage of the multi-stage sigma delta converter is coupled to a next stage in the cascade by a digital-to-analog (D/A) converter.

15. The method of claim 12 wherein each stage of the multi-stage sigma delta converter is coupled to a next stage in the cascade by a forward loop.

16. The method of claim 15 further comprising:
scaling an output of a last D/A converter; and
adding the scaled output to an output of a last delay integrator used for digital filtering to generate a final digital output.

17. The method of claim 15 further comprising:
converting an output of a last delay integrator in the cascaded sigma-delta converter to a digital value;
scaling the digital value; and
adding the scaled output to an output of a last delay integrator used for digital filtering to generate a final digital output.

18. The method of claim 12 wherein the stages of the multi-stage sigma-delta converter are arranged in a 1-1 configuration.

19. The method of claim 12 wherein the stages of the multi-stage sigma-delta converter are arranged in a 2-1-1 configuration.

20. The method of claim 12 further comprising:
resetting all of the delay integrators in the first number and in the second number after a digital output value for a last delay integrator in the digital filtering has settled.

* * * * *